(12) United States Patent
Kasibhatla et al.

(10) Patent No.: US 12,073,871 B2
(45) Date of Patent: *Aug. 27, 2024

(54) METHOD OF PERFORMING INTERNAL PROCESSING OPERATION OF MEMORY DEVICE

(71) Applicant: SAMSUNG ELECTRONICS CO., LTD., Suwon-si (KR)

(72) Inventors: Pavan Kumar Kasibhatla, Suwon-si (KR); Seong-il O, Suwon-si (KR); Hak-soo Yu, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/223,078

(22) Filed: Jul. 18, 2023

(65) Prior Publication Data

US 2023/0360693 A1    Nov. 9, 2023

Related U.S. Application Data

(63) Continuation of application No. 17/883,498, filed on Aug. 8, 2022, now Pat. No. 11,790,981, which is a
(Continued)

(30) Foreign Application Priority Data

Jul. 30, 2018 (KR) .................. 10-2018-0088682

(51) Int. Cl.
*G11C 11/40* (2006.01)
*G06F 15/78* (2006.01)
(Continued)

(52) U.S. Cl.
CPC ...... *G11C 11/4091* (2013.01); *G06F 15/7821* (2013.01); *G11C 7/1006* (2013.01);
(Continued)

(58) Field of Classification Search
None
See application file for complete search history.

(56) References Cited

U.S. PATENT DOCUMENTS 5,678,021 A * 10/1997 Pawate ............... G06F 15/7821
711/147
7,174,415 B2  2/2007 Ironi et al.
(Continued)

FOREIGN PATENT DOCUMENTS

CN    107450890 A    12/2017
JP    2017-182803 A   10/2017
(Continued)

OTHER PUBLICATIONS

Communication issued Apr. 4, 2023 by the Japanese Patent Office in counterpart Japanese Patent Application No. 2019-106861.
(Continued)

*Primary Examiner* — Tracy C Chan
(74) *Attorney, Agent, or Firm* — Sughrue Mion, PLLC

(57) ABSTRACT

Provided is a method of performing an internal processing operation of a memory device in a system including a host device and the memory device. The memory device includes a memory cell array and a processor-in-memory (PIM) performing an internal processing operation. In an internal processing mode, by the PIM, the memory device performs the internal processing operation based on internal processing information stored in the memory cell array. When the internal processing information is an internal processing operation command indicating a type of the internal processing operation, the memory device outputs the internal processing operation command including an internal processing read command and an internal processing write command to the host device. The host device issues to the memory device a priority command determined from among
(Continued)

a data transaction command and the internal processing operation command.

20 Claims, 7 Drawing Sheets

Related U.S. Application Data continuation of application No. 17/369,010, filed on Jul. 7, 2021, now Pat. No. 11,482,278, which is a continuation of application No. 16/251,983, filed on Jan. 18, 2019, now Pat. No. 11,074,961.

(51) Int. Cl.
| | | |
|---|---|---|
| *G11C 7/10* | (2006.01) | |
| *G11C 11/408* | (2006.01) | |
| *G11C 11/4091* | (2006.01) | |
| *G11C 11/4093* | (2006.01) | |
| *G11C 11/4096* | (2006.01) | |

(52) U.S. Cl.
CPC ...... *G11C 11/4087* (2013.01); *G11C 11/4093* (2013.01); *G11C 11/4096* (2013.01)

(56) References Cited

U.S. PATENT DOCUMENTS

| | | | |
|---|---|---|---|
| 8,234,460 B2 | 7/2012 | Walker | |
| 8,719,516 B2 | 5/2014 | Walker et al. | |
| 9,348,638 B2 | 5/2016 | Dalal et al. | |
| 9,761,300 B1 | 9/2017 | Willcock | |
| 9,817,582 B2 | 11/2017 | Green et al. | |
| 9,836,277 B2 | 12/2017 | Guz | |
| 9,983,821 B2 | 5/2018 | Sala et al. | |
| 10,416,896 B2 | 9/2019 | O et al. | |
| 2011/0093662 A1* | 4/2011 | Walker | G06F 3/0683 711/147 |
| 2012/0131277 A1 | 5/2012 | Kim | |
| 2012/0246401 A1* | 9/2012 | Agam | G11C 7/1006 711/E12.001 |
| 2015/0042380 A1 | 2/2015 | Manning | |
| 2015/0046660 A1* | 2/2015 | Kim | G06F 12/0833 711/146 |
| 2015/0106574 A1 | 4/2015 | Jayasena et al. | |
| 2015/0293864 A1 | 10/2015 | Hill | |
| 2016/0041856 A1 | 2/2016 | Sankaralingam et al. | |
| 2016/0147667 A1 | 5/2016 | Awasthi et al. | |
| 2017/0344301 A1 | 11/2017 | Ryu | |
| 2018/0107406 A1 | 4/2018 | O et al. | |
| 2019/0310797 A1 | 10/2019 | Lee | |

FOREIGN PATENT DOCUMENTS

| | | |
|---|---|---|
| KR | 10-2012-0034712 A | 4/2012 |
| KR | 10-2018-0042111 A | 4/2018 |
| TW | 201111998 A | 4/2011 |
| TW | 201137628 A | 11/2011 |

OTHER PUBLICATIONS

Communication dated Sep. 7, 2022 issued by the Taiwan Patent Office in TW Patent Application No. 108112341.

Communication dated Aug. 24, 2023 issued by the Korean Intellectual Property Office in counterpart Korean Application No. 10-2018-0088682.

Communication dated Feb. 20, 2024, issued by the Japan Patent Office in counterpart Japanese Patent Application No. 2019-106861.

Gang Luo et al., "Apply the Precedure from the Leading and Burn to Write of TMS320C6X DSP FLASH By Using Simulator Interface System", Modern Electronics Technique, Issue No. 4, Apr. 1, 2005, pp. 12-14, ISSN: 1004-373X.

Communication issued on Jun. 26, 2024 by the China National Intellectual Property Administration for Chinese Patent Application No. 201910201920.2.

* cited by examiner

METHOD OF PERFORMING INTERNAL PROCESSING OPERATION OF MEMORY DEVICE

CROSS-REFERENCE TO THE RELATED APPLICATIONS

This application is a continuation of U.S. patent application Ser. No. 17/883,498, filed Aug. 8, 2022, which is a continuation of U.S. patent application Ser. No. 17/369,010, filed Jul. 7, 2021, now U.S. Pat. No. 11,482,278, issued on Oct. 25, 2022, which is a continuation of U.S. patent application Ser. No. 16/251,983, filed Jan. 18, 2019, now U.S. Pat. No. 11,074,961, issued Jul. 27, 2021, which claims priority from Korean Patent Application No. 10-2018-0088682, filed on Jul. 30, 2018, in the Korean Intellectual Property Office, the disclosures of which are incorporated herein in their entirety by reference.

BACKGROUND

Apparatuses and methods consistent with exemplary embodiments of the inventive concept relate to a memory device performing an internal processing operation, a method of operating the memory device, and a memory system including the memory device.

Various systems such as computer graphics, servers, supercomputers, and networks that require high performance and low power consumption are being developed. These systems include memory devices which store data or instructions used by hosts included in the systems or perform computational operations.

A dynamic random access memory (DRAM) is a memory device having high response speed and high operation speed characteristics. A system generally uses the DRAM as a working memory or a main memory of the system. A general DRAM writes data or reads written data under the control of a host. When performing a computational operation, the host retrieves instructions and/or data from the DRAM and uses the data to execute the instructions and/or to perform the computational operation. When there are results of the computational operation, the host writes the results of the computational operation back to the DRAM.

System performance may be degraded if an operation of retrieving instructions and/or data from the DRAM and writing back to the DRAM is relatively slow while a computational operation performed by the host is considerably fast. Also, in the case of a data-intensive system, system performance may be degraded due to the memory bandwidth limitation of the DRAM.

In order to improve the system performance, a memory device including an internal processor is developed to perform some of the computation operations of the host by internal processing. The computational workload of the host may be reduced due to the internal processing of the memory device.

However, in order to prevent a collision between the internal processing and the processing by the host, the memory device may need to perform an arbiter function to determine a priority thereof. Also, the memory device may perform an operation of reading and writing in the memory device by internal processing. In this case, when data stored in a cache of the host is changed in the memory device, the data in the cache is not the latest data, whereby there may be a limitation in the coherence of cache data. Accordingly, the memory device may need to perform a virtual memory management function such as a virtual memory address translation across the host and the memory device.

Performing the arbiter function and the virtual memory management function in the memory device performing the internal processing may have a limitation in that the hardware configurations and/or implementations of the memory device are complex and difficult.

Information disclosed in this Background section has already been known to the inventors before achieving the disclosure of the present application or is technical information acquired in the process of achieving the disclosure. Therefore, it may contain information that does not form the prior art that is already known to the public.

SUMMARY

Exemplary embodiments of the inventive concept provide a memory device performing an internal processing operation by entrusting an arbiter function and a virtual memory management function to a host, a method of operating the memory device, and a system including the memory device.

According to an aspect of the inventive concept, there is provided a memory device including: a memory cell array configured to store internal processing information; and a processor-in-memory (PIM) configured to perform an internal processing operation based on the internal processing information in an internal processing mode, wherein, in response to determining that the internal processing information includes an internal processing operation command indicating a type of the internal processing operation, the PIM outputs the internal processing operation command to an external device.

According to an aspect of the inventive concept, there is provided a method of operating a memory device including a memory cell array and a processor-in-memory (PIM) performing an internal processing operation, the method including: entering an internal processing mode under control of an external device; performing, by the PIM, the internal processing operation in the internal processing mode based on internal processing information stored in the memory cell array; and in response to determining that the internal processing information includes an internal processing operation command indicating a type of the internal processing operation, outputting the internal processing operation command to the external device.

According to an aspect of the inventive concept, there is provided a host device including: a host processor configured to perform a computational operation and issue a memory request command according to the computational operation; and a memory controller configured to receive the memory request command, issue a data transaction command for accessing a memory device according to the memory request command, and control an internal processing mode of the memory device, wherein the memory controller is further configured to receive from the memory device an internal processing operation command generated during an internal processing operation in the internal processing mode, and issue to the memory device a priority command determined from among the data transaction command and the internal processing operation command.

According to an aspect of the inventive concept, there is provided a method of operating a host device including a host processor and a memory controller, the method including: issuing, by the host processor, a memory request command according to a computational operation; issuing, by the memory controller, a data transaction command for accessing a memory device according to the memory request command; controlling, by the memory controller, the memory device to enter an internal processing mode; receiving, by the memory controller, an internal processing operation command generated during an internal processing operation in the internal processing mode, from the memory device; and issuing, by the memory controller, a priority command determined from among the data transaction command and the internal processing operation command, to the memory device.

According to an aspect of the inventive concept, there is provided a system including: a host device performing a computational operation; and a memory device performing, under control of the host device, an internal processing operation based on a memory request operation according to the computational operation and internal processing information stored in a memory cell array, wherein, the internal processing information includes an internal processing operation command which the memory device transmits to the host device, and wherein, according to the internal processing operation command, the host device controls the memory device to perform the internal processing operation.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

The embodiments described herebelow are all exemplary, and thus, the inventive concept is not limited to these embodiments disclosed below and may be realized in various other forms. An embodiment provided in the following description is not excluded from being associated with one or more features of another example or another embodiment also provided herein or not provided herein but consistent with the inventive concept. For example, even if matters described in a specific example are not described in a different example thereto, the matters may be understood as being related to or combined with the different example, unless otherwise mentioned in descriptions thereof.

Figure 1:
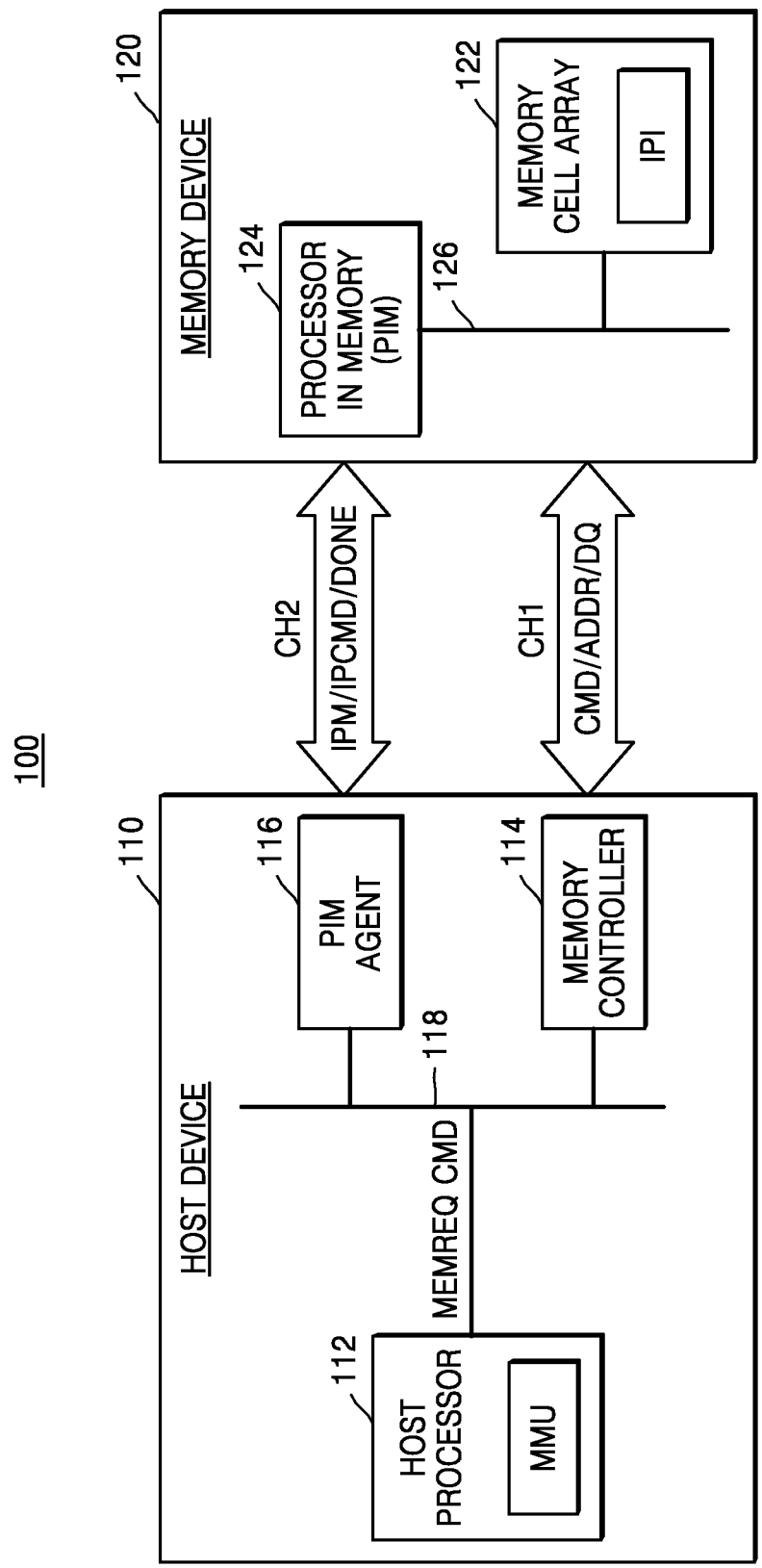
FIG. 1 is a block diagram illustrating a system including a memory device performing an internal processing operation, according to an embodiment of the inventive concept.

FIG. 1 is a block diagram illustrating a system including a memory device performing an internal processing operation, according to an embodiment of the inventive concept.

Referring to FIG. 1, a system 100 may include a host device 110 and a memory device 120. The host device 110 may be communicatively connected to the memory device 120 through channels CH1 and CH2. The memory device 120 may operate in any one of a normal mode of performing a data transaction operation and an internal processing mode of performing an internal processing operation. The data transaction operations of the memory device 120 may include write/read operations to/from a memory cell array 122. The memory device 120 may be a processor-in-memory (PIM)-type memory device including a PIM performing an internal processing operation.

The host device 110 may be, for example, a computing system such as a computer, a notebook computer, a server, a workstation, a portable communication terminal, a personal digital assistant (PDA), a portable multimedia player (PMP), a smart phone, or a wearable device. Alternatively, the host device 110 may be some of the components included in a computing system, such as a graphics card.

The host device 110 may include a host processor 112, a memory controller 114, and a PIM agent 116. The host processor 112, the memory controller 114, and the PIM agent 116 may be interconnected through a bus 118 including at least one or more signal lines.

The host processor 112 may be a functional block performing general computational operations in the system 100, and may correspond to a central processing unit (CPU), a graphics processing unit (GPU), or an application processor (AP). The host processor 112 may issue a memory request command MEMREQ CMD associated with memory requests for computational operations. The host processor 112 may include a memory management unit (MMU). When the MMU issues memory request commands MEMREQ CMD to the memory device 120, the MMU may perform a virtual memory management function such as a virtual memory address translation.

The memory controller 114 may access the memory device 120 according to the memory request commands MEMREQ CMD of the host processor 112. The memory controller 114 may prioritize and issue the memory request commands MEMREQ CMD to the memory device 120. That is, the memory controller 114 may perform an arbiter function.

The memory controller 114 may control the memory device 120 to write data to the memory device 120 or to read data written in the memory device 120. The memory controller 114 may control a write or read operation on the memory device 120 by providing a command CMD and an address ADDR to the memory device 120. Also, write data DQ and read data DQ may be exchanged between the memory controller 114 and the memory device 120. This data transaction operation may be performed through a first channel CH1 performing a predetermined protocol (e.g., DDR protocol) between the host device 110 and the memory device 120. The first channel CH1 may include buses or signal lines for transmitting the command CMD, the address ADDR, and the data DQ.

The PIM agent 116 may control the memory device 120 to operate in the internal processing mode. The PIM agent 116 may generate and transmit an internal processing mode signal IPM to the memory device 120. The memory device 120 may perform an internal processing operation in response to the internal processing mode signal IPM. The internal processing mode signal IPM may be a particular dedicated signal. In this case, the internal processing mode signal IPM may be transmitted to the memory device 120 through buses and/or signal lines of a second channel CH2 between the host device 110 and the memory device 120.

According to an embodiment, the PIM agent 116 may activate and transmit the internal processing mode signal IPM to the memory device 120. The internal processing mode signal IPM may be transmitted to the memory device 120 as a combination of several signals, such as a command combination, a mode register set (MRS), or an address combination. In this case, the internal processing mode signal IPM may be transmitted to the memory device 120 through the buses and/or signal lines of the first channel CH1 between the host device 110 and the memory device 120.

The internal processing mode signal IPM may allow the memory device 120 to operate in the internal processing mode. In the internal processing mode, an internal processing operation may include accessing the memory cell array 122 to perform a processing operation on the data stored in the memory cell array 122.

For example, the internal processing operation may be a processing operation on the data stored in the memory cell array 122, such as data inversion, data shift, data swap, data comparison, logical operations (AND, XOR, etc.), or mathematical operations (addition, subtraction, etc.). The memory device 120 may transmit an internal processing operation command IPCMD indicating a type of the internal processing operation to the host device 110. In this case, the internal processing operation command IPCMD may be transmitted to the PIM agent 116 through the buses and/or signal lines of the second channel CH2 between the host device 110 and the memory device 120. The internal processing operation command IPCMD may include an internal processing read command PIM_READ and/or an internal processing write command PIM_WRITE.

The PIM agent 116 may receive, from the memory device 120, the internal processing operation command IPCMD generated while the memory device 120 operates in the internal processing mode. The PIM agent 116 may transmit the received internal processing operation command IPCMD to the memory controller 114 through the bus 118. The memory controller 114 may receive the internal processing operation command IPCMD and transmit the received internal processing operation command IPCMD to the memory device 120 as the command CMD. The memory controller 114 may transmit the internal processing read command PIM_READ and/or the internal processing write command PIM_WRITE constituting the internal processing operation command IPCMD to the memory device 120 as the command CMD. In this case, the internal processing operation command IPCMD may be transmitted to the memory device 120 through the command (CMD) buses and/or signal lines of the first channel CH1 between the host device 110 and the memory device 120.

When an internal processing operation according to internal processing information IPI stored in the memory cell array 122 in the memory device 120 is completed, the memory device 120 may transmit, to the host device 110, a completion signal DONE indicating that the internal processing operation is completed. When the PIM agent 116 of the host device 110 receives the completion signal DONE, the internal processing mode of the memory device 120 may be exited. In this case, the completion signal DONE may be transmitted to the PIM agent 116 through the buses and/or signal lines of the second channel CH2 between the host device 110 and the memory device 120.

The memory controller 114 may receive a memory request command MEMREQ CMD of the host processor 112, and generate a data transaction command to perform a data transaction operation according to the memory request command MEMREQ CMD. The memory controller 114 may issue a data transaction command according to a data transaction operation to the memory device 120, and the memory device 120 may operate in the normal mode according to the data transaction command. The memory controller 114 may issue the internal processing operation command IPCMD to the memory device 120, and the memory device 120 may operate in the internal processing mode.

When issuing the data transaction command and the internal processing operation command IPCMD to the memory device 120, the memory controller 114 may prioritize and issue these commands to the memory device 120. The memory controller 114 may perform an arbiter function to determine or select a priority command to be preferentially processed from among the data transaction command and the internal processing operation command IPCMD, and issue the priority command to the memory device 120. The memory controller 114 may issue the priority command to the memory device 120 through the CMD buses and/or CMD signal lines of the first channel CH1 between the host device 110 and the memory device 120.

The memory device 120 may write data or read data under the control of the memory controller 114. For example, the memory device 120 may include dynamic random access memory (DRAM). However, the inventive concept is not limited thereto, and the memory device 120 may include any one of volatile memory devices such as Static RAM (SRAM), DRAM, Synchronous DRAM (SDRAM), Double Data Rate SDRAM (DDR SDRAM) Low Power Double Data Rate (LPDDR) SDRAM, Wide I/O DRAM, High Bandwidth Memory (HBM), and Hybrid Memory Cube (HMC). According to an embodiment, the memory device 120 may include any one of nonvolatile memory devices such as flash memory devices, Phase-change RAM (PRAM), Magnetic RAM (MRAM), Resistive RAM (RRAM), and Ferroelectric RAM (FRAM).

The memory device 120 may include a memory cell array 122 and a PIM 124. The memory cell array 122 and the PIM 124 may be interconnected through at least one or more signal lines 126.

The memory cell array 122 may include a plurality of memory cells. The plurality of memory cells may be connected to a plurality of word lines and a plurality of bit lines, respectively. The memory cell array 122 may store internal processing information IPI under the control of the host device 110. The internal processing information IPI may be information for an internal processing operation performed by the PIM 124, and may include information such as an internal processing operation command IPCMD and internal processing data. The internal processing data may include particular address information according to the internal processing operation command IPCMD such as data swap.

The PIM 124 may perform an internal processing operation under the control of the host device 110. The PIM 124 may receive the internal processing mode signal IPM from the host device 110 and enter the internal processing mode in response to the received internal processing mode signal IPM. The PIM 124 may perform an internal processing operation based on the internal processing information IPI stored in the memory cell array 122 in the internal processing mode. For example, the internal processing operation may refer to a processing operation on the data stored in the memory cell array 122, such as data inversion, data shift, data swap, data comparison, logical operations, or mathematical operations.

The PIM 124 may generate and transmit a completion signal DONE to the host device 110 after completing the internal processing operation according to the internal processing information IPI stored in the memory cell array 122. The completion signal DONE may be transmitted to the PIM agent 116 through the buses and/or signal lines of the second channel CH2 between the host device 110 and the memory device 120.

Like the host processor 112, the PIM 124 included in the memory device 120 may be hardware having a processing function. When the PIM 124 is referred to as an internal processor, the term "internal" may mean that it is in the memory device 120. Thus, a processor that is "external" to the memory device 120 may refer to, for example, the host processor 112.

The memory device 120 may operate in a normal mode of performing a data transaction operation under the control of the host device 110 or in an internal processing mode of performing an internal processing operation.

In the normal mode, the memory device 120 may perform a data transaction operation through the first channel CH1 under the control of the host device 110. The data transaction operation may refer to performing a write operation and/or a read operation according to a predetermined Joint Electron Device Engineering Council (JEDEC) timing specification such as a DDR protocol. In the normal mode, the write operation and/or the read operation of the memory device 120 may be performed by the memory controller 114 of the host device 110. In the normal mode, a command CMD, an address ADDR, and/or data DQ for the write operation and/or the read operation of the memory device 120 may be transmitted to the memory device 120 through the buses and/or signal lines of the first channel CH1 between the host device 110 and the memory device 120.

In the internal processing mode, the memory device 120 may perform an internal processing operation through the first channel CH1 or the second channel CH2 under the control of the host device 110. The host device 110 may activate and transmit an internal processing mode signal IPM to the memory device 120 in order for the memory device 120 to enter the internal processing mode. The internal processing mode signal IPM may be transmitted through the buses and/or signal lines of the first channel CH1 or the second channel CH2 between the host device 110 and the memory device 120.

The memory device 120 may enter the internal processing mode in response to the internal processing mode signal IPM. When the internal processing mode is entered, internal processing information IPI may be written or uploaded into the memory cell array 122 under the control of the host device 110. A write operation on the internal processing information IPI may be performed by a write command CMD of the memory device 120. The internal processing information IPI may be transmitted through the buses and/or signal lines of the first channel CH1 between the host device 110 and the memory device 120.

In the internal processing mode, when the internal processing information IPI is previously written or uploaded into the memory cell array 122, the write operation on the internal processing information IPI may be skipped. For example, when the system 100 is powered on, information stored in a separate storage medium (e.g., a solid state drive (SSD)) included in the system 100 may be pre-loaded and stored into the memory cell array 122. In the internal processing mode, the memory device 120 may read the internal processing information IPI written in the memory cell array 122. The PIM 124 may read the internal processing information IPI. When the read internal processing information IPI includes or is an internal processing operation command IPCMD indicating a type of an internal processing operation (e.g., data inversion, data shift, data swap, data comparison, logical operations, or mathematical operations), the PIM 124 may transmit an internal processing read command PIM_READ and/or an internal processing write command PIM_WRITE constituting the internal processing operation command IPCMD to the host device 110. The internal processing operation command IPCMD may be transmitted to the PIM agent 116 through the buses and/or signal lines of the second channel CH2 between the host device 110 and the memory device 120.

As described above, the memory controller 114 of the host device 110 may perform an arbiter function to prioritize and issue a data transaction command and an internal processing operation command IPCMD to the memory device 120. Accordingly, the memory device 120 may not need to perform an additional arbiter function. Also, when the memory controller 114 issues an internal processing operation command IPCMD to the memory device 120, the MMU of the host processor 112 may perform a virtual memory management function such as a virtual memory address translation according to the internal processing operation command IPCMD. Accordingly, the memory device 120 may not need to perform a virtual memory management function associated with an internal processing operation. That is, since an arbiter function and a virtual memory management function are entrusted to the host device 110, the memory device 120 may perform an internal processing operation simply and easily without a complex hardware configuration and/or implementation.

Figure 2:
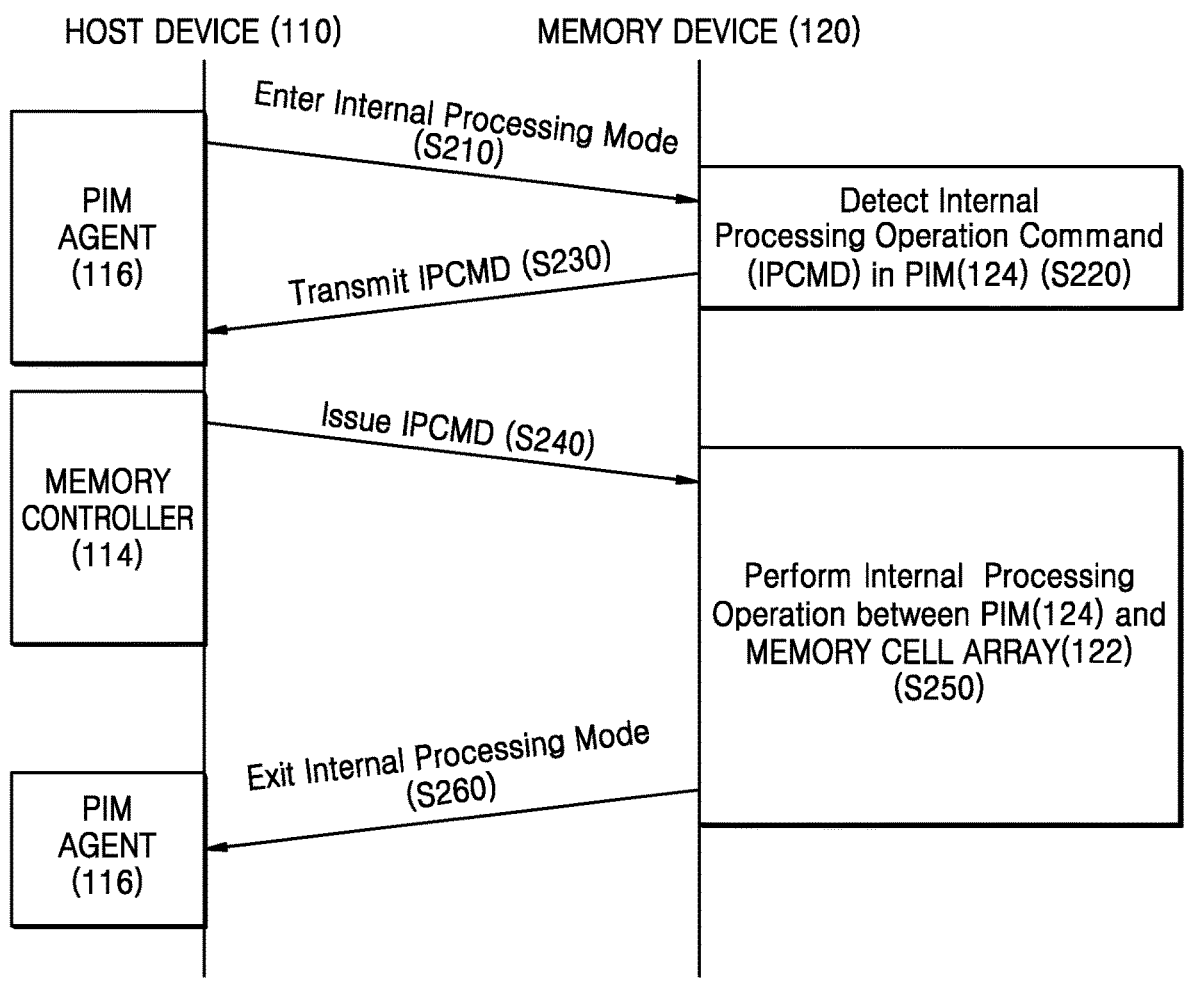
FIG. 2 is a diagram illustrating an operation of the system of FIG. 1.

FIG. 2 is a diagram illustrating an operation of the system 100 of FIG. 1.

Referring to FIG. 2 in conjunction with FIG. 1, in operation S210, the host device 110 may instruct the memory device 120 to enter the internal processing mode. The PIM agent 116 of the host device 110 may activate and transmit an internal processing mode signal IPM including a combination of various signals, such as a dedicated signal or command combination, an MRS, or an address combination, to the memory device 120. The internal processing mode signal IPM may be transmitted through the buses and/or signal lines of the first channel CH1 or the second channel CH2 between the host device 110 and the memory device 120.

In operation S220, in response to the internal processing mode signal IPM, the memory device 120 may enter the internal processing mode and perform an internal processing operation.

When the memory device 120 enters the internal processing mode, the host device 110 may control the memory device 120 such that the internal processing information IPI for the internal processing operation to be performed by the PIM 124 may be written or uploaded into the memory cell array 122. A write operation on the internal processing information IPI may be performed through the buses and/or signal lines of the first channel CH1 between the host device 110 and the memory device 120. The PIM 124 may detect whether the internal processing information IPI includes an internal processing operation command IPCMD in operation S220.

In operation S230, the memory device 120 may transmit, to the host device 110, the internal processing operation command IPCMD detected while operating in the internal processing mode.

In the internal processing mode, the PIM 124 of the memory device 120 may perform the internal processing operation based on the internal processing information IPI stored in the memory cell array 122. The PIM 124 may read the internal processing information IPI stored in the memory cell array 122. When the read internal processing information IPI includes or is an internal processing operation command IPCMD indicating a type of the internal processing operation (e.g., data inversion, data shift, data swap, data comparison, logical operations, or mathematical operations), the PIM 124 may transmit an internal processing read command PIM_READ and/or an internal processing write command PIM_WRITE constituting the internal processing operation command IPCMD to the host device 110. The internal processing operation command IPCMD including the internal processing read command PIM_READ and/or the internal processing write command PIM_WRITE may be transmitted to the PIM agent 116 through the buses and/or signal lines of the second channel CH2 between the host device 110 and the memory device 120.

In operation S240, the host device 110 may issue, to the memory device 120, the internal processing operation command IPCMD received from the memory device 120.

The PIM agent 116 of the host device 110 may receive the internal processing operation command IPCMD including the internal processing read command PIM_READ and/or the internal processing write command PIM_WRITE from the PIM 124, and transmit the received internal processing operation command IPCMD to the memory controller 114 through the bus 118. The memory controller 114 may determine or select a priority command to be preferentially processed from among the received internal processing operation command IPCMD and a data transaction command to be issued to the memory device 120.

In the present embodiment, when the priority command is the internal processing operation command IPCMD, the memory controller 114 may issue the internal processing operation command IPCMD to the memory device 120. The memory controller 114 may issue the internal processing operation command IPCMD to the memory device 120 through the CMD buses and/or CMD signal lines of the first channel CH1 between the host device 110 and the memory device 120. In another embodiment, when the priority command is a data transaction command, the memory controller 114 may issue the data transaction command to the memory device 120 through the CMD buses and/or CMD signal lines of the first channel CH1 between the host device 110 and the memory device 120.

In operation S250, the memory device 120 may perform the internal processing operation through the signal lines 126 between the PIM 124 and the memory cell array 122 according to the internal processing operation command IPCMD including the internal processing read command PIM_READ and/or the internal processing write command PIM_WRITE issued from the memory controller 114.

Some or most of the internal processing operations may be data communication operations performed by the internal processing operation command IPCMD. The data communication operations may include an operation of reading internal processing data such as reference data, source data, destination data, or target data used in the internal processing operation from the memory cell array 122 and an operation of writing the processing result of the internal processing operation to the memory cell array 122. For example, it is assumed that the PIM 124 may perform data search, data transfer, data addition, or data swap according to the internal processing operation command IPCMD including the internal processing read command PIM_READ and/or the internal processing write command PIM_WRITE.

When the internal processing operation command IPCMD including the internal processing read command PIM_READ and/or the internal processing write command PIM_WRITE is a command for data search, the PIM 124 may determine, according to the internal processing read command PIM_READ, whether the internal processing data is stored in the memory cell array 122. The PIM 124 may output hit/miss or address information as the processing result of the data search operation. The PIM 124 may write the hit/miss or address information according to the data search operation into the memory cell array 122 according to the internal processing write command PIM_WRITE.

When the internal processing operation command IPCMD including the internal processing read command PIM_READ and/or the internal processing write command PIM_WRITE is a command for data transfer, the PIM 124 may transfer data corresponding to reference address information to a target region according to the internal processing read command PIM_READ and the internal processing write command PIM_WRITE. The PIM 124 may output address information about the target region as the processing result of the data transfer operation. The operations of transferring the data and writing the address information of the target region by the PIM 124 may be performed in the memory cell array 122.

When the internal processing operation command IPCMD including the internal processing read command PIM_READ and/or the internal processing write command PIM_WRITE is a command for data addition, the PIM 124 may read the data corresponding to the reference address information from the memory cell array 122 according to the internal processing read command PIM_READ, and may add the internal processing data to the read data and store the addition result in the memory cell array 122 according to the internal processing write command PIM_WRITE. The PIM 124 may output address information about a region where the addition result data is stored, as the processing result of the data addition operation. The operations of adding the data and writing the address information about the region where the addition result data is stored by the PIM 124 may be performed in the memory cell array 122.

When the internal processing operation command IPCMD including the internal processing read command PIM_READ and/or the internal processing write command PIM_WRITE is a command for data swap, the PIM 124 may read first and second data respectively corresponding to first and second reference address information from the memory cell array 122 according to the internal processing read command PIM_READ, swap the read first and second data, and store the swapped first and second data in the memory cells corresponding to the first and second reference address information about the memory cell array 122 according to the internal processing write command PIM_WRITE, respectively. The data swap operation by the PIM 124 may be performed in the memory cell array 122.

The above operations S220 to S250 may be repeatedly performed until the PIM 124 processes all of the internal processing information IPI stored in the memory cell array 122.

In operation S260, the memory device 120 may complete the internal processing operation according to the internal processing information IPI, and exit the internal processing mode.

The PIM 124 may transmit a completion signal DONE to the host device 110 after completing the internal processing operation according to the internal processing information IPI stored in the memory cell array 122. The completion signal DONE may be transmitted to the PIM agent 116 through the buses and/or signal lines of the second channel CH2 between the host device 110 and the memory device 120.

Figure 3:
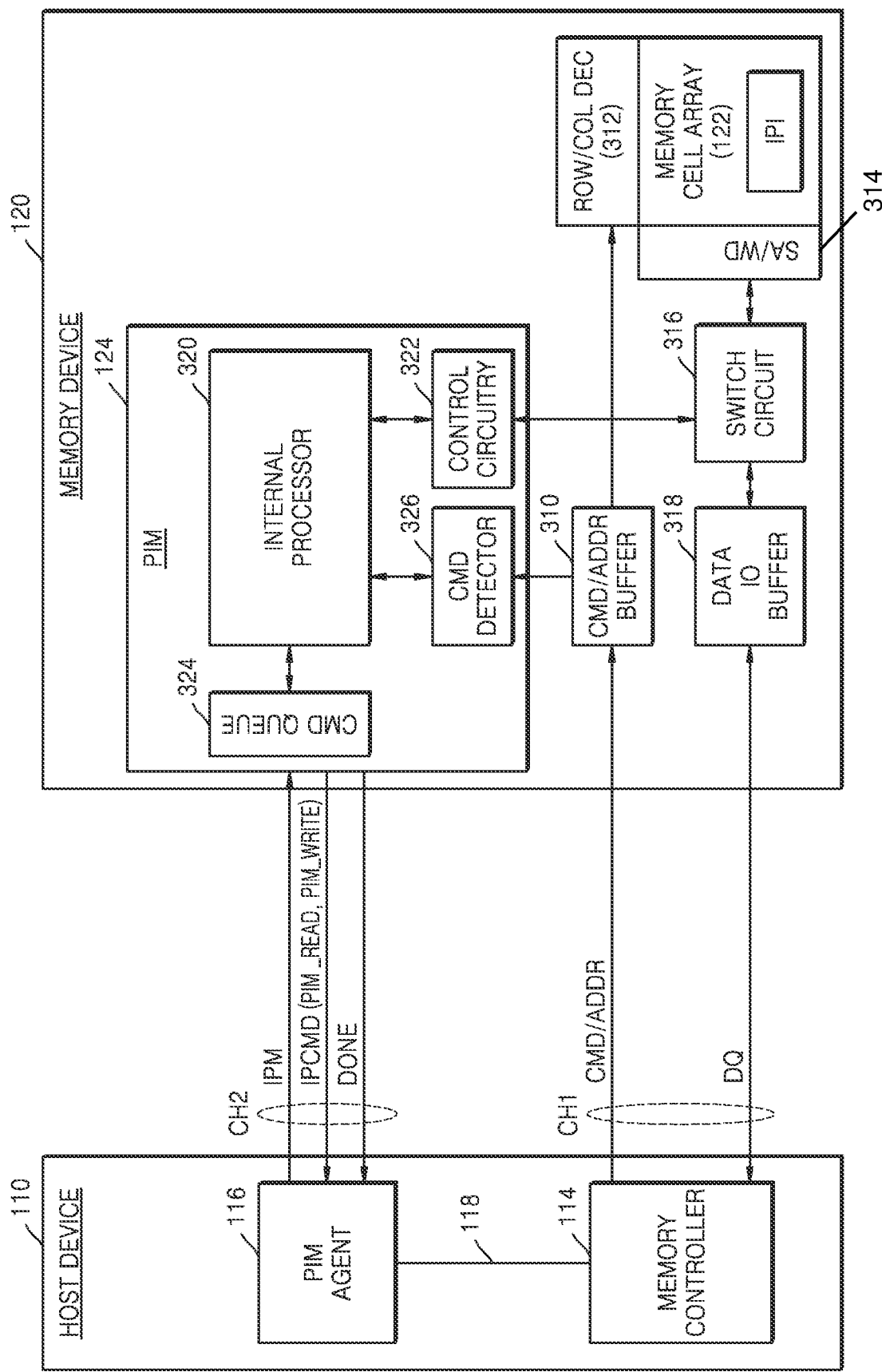
FIG. 3 is a block diagram illustrating a memory device according to an embodiment of the inventive concept.

FIG. 3 is a block diagram illustrating a memory device according to an embodiment of the inventive concept. In the present embodiment, the memory device 120 is assumed to be DRAM; however, the scope of the inventive concept is not limited thereto.

Referring to FIGS. 1 and 3, the memory device 120 may include a memory cell array 122, a PIM 124, a command/address buffer 310, a row/column decoder 312, a sense amplifier/write driver 314, a switch circuit 316, and a data input/output (IO) buffer 318.

The memory cell array 122 may include a plurality of memory cells provided in a matrix form arranged in rows and columns. The memory cell array 122 may include a plurality of word lines and a plurality of bit lines connected to the memory cells. The plurality of word lines may be connected to the rows of the memory cells, and the plurality of bit lines may be connected to the columns of the memory cells.

The command/address buffer 310 may receive control signals corresponding to the command CMD from the memory controller 114 through the first channel CH1. The control signals may include, for example, a write enable signal/WE, a row address strobe signal/RAS, a column address strobe signal/CAS, and/or a chip selection signal/CS, and the command CMD may include, for example, an active command, a read command, a write command, and/or a precharge command.

The command/address buffer 310 may receive an address ADDR from the memory controller 114 through the first channel CH1. The address ADDR may include a row address for addressing a row of the memory cell array 122 and a column address for addressing a column of the memory cell array 122. The command/address buffer 310 may transmit the row address and the column address to the row/column decoder 312.

The row/column decoder 312 may select any one of the plurality of word lines connected to the memory cell array 122. The row/column decoder 312 may decode the row address received from the command/address buffer 310, select a word line corresponding to the row address, and activate the selected word line.

The row/column decoder 312 may select a certain bit line among the plurality of bit lines connected to the memory cell array 122. The row/column decoder 312 may decode the column address received from the command/address buffer 310 and select certain bit lines corresponding to the column address.

The sense amplifier/write driver 314 may sense a voltage change of the bit lines selected by the row/column decoder 312, and provide output data to the switch circuit 316 based on the sense-amplified voltage. Also, the sense amplifier/write driver 314 may receive data from the switch circuit 316 and write the received data into the memory cells connected to the bit lines selected by the row/column decoder 312.

The data input/output buffer 318 may receive data from the memory controller 114 through the first channel CH1, and provide the received data to the switch circuit 316. Also, the data input/output buffer 318 may receive data from the switch circuit 316 and provide the received data to the memory controller 114 through the data DQ buses and/or the data DQ signal lines of the first channel CH1.

The switch circuit 316 may be selectively controlled such that the memory device 120 performs a data transaction operation according to the normal mode of the memory device 120, and performs an internal processing operation according to the internal processing mode of the memory device 120.

In a read operation of the normal mode, the switch circuit 316 may transmit the data received from the memory cell array 122 and the sense amplifier/write driver 314 to the data input/output buffer 318. The data input/output buffer 318 may provide the data received from the switch circuit 316 to the memory controller 114 through the first channel CH1.

In a write operation of the normal mode, the switch circuit 316 may transmit the data received from the data input/output buffer 318 to the sense amplifier/write driver 314. The sense amplifier/write driver 314 may write the data received from the switch circuit 316 into the memory cells connected to the word line and bit lines selected by the row/column decoder 312.

In the internal processing mode, the switch circuit 316 may receive the internal processing information IPI from the data input/output buffer 318 and write or upload the received internal processing information IPI into the memory cell array 122 through the sense amplifier/write driver 314. Thereafter, the internal processing information IPI written into the memory cell array 122 may be accessed or read by the PIM 124.

In the internal processing mode, the switch circuit 316 may receive the internal processing information IPI read from the memory cell array 122 through the sense amplifier/write driver 314 and transmit the received internal processing information IPI to the PIM 124.

The PIM 124 may be implemented as a compute-intensive core, a GPU accelerator, or a field programmable gate array (FPGA). Alternatively, the PIM 124 may be implemented as a neural processing unit (NPU) that performs parallel computing, data reuse, locality of data values, or a deep neural network. The PIM 124 may include an internal processor 320, a control circuit 322, a command queue 324, and a command detector 326.

The internal processor 320 may perform an internal processing operation based on the internal processing information IPI. The internal processor 320 may receive the internal processing mode signal IPM from the host device 110 and enter the internal processing mode in response to the received internal processing mode signal IPM. In the internal processing mode, the internal processor 320 may read the internal processing information IPI from the memory cell array 122 and perform an internal processing operation based on the read internal processing information IPI. The internal processor 320 may generate and transmit a completion signal DONE to the PIM agent 116 after completing the internal processing operation according to the internal processing information IPI.

According to the normal mode or the internal processing mode of the memory device 120, the control circuit 322 may control the switch circuit 316 to configure a data path.

In the normal mode, the control circuit 322 may control the switch circuit 316 to configure a normal data path connecting the first channel CH1, the data input/output buffer 318, the switch circuit 316, the sense amplifier/write driver 314, and the memory cell array 122. A data transaction operation may be performed through the normal data path.

In the internal processing mode, the control circuit 322 may control the switch circuit 316 to write or upload the internal processing information IPI into the memory cell array 122. In this case, the control circuit 322 may configure a normal data path connecting the first channel CH1, the data input/output buffer 318, the switch circuit 316, the sense amplifier/write driver 314, and the memory cell array 122, and the internal processing information IPI transmitted through the normal data path may be written into the memory cell array 122.

In the internal processing mode, the control circuit 322 may control the switch circuit 316 to configure an internal operation data path connecting the PIM 124, the switch circuit 316, the sense amplifier/write driver 314, and the memory cell array 122. The internal processing information IPI read from the memory cell array 122 through the internal operation data path may be transmitted to the internal processor 320 of the PIM 124. Also, the processing result of the internal processing operation performed according to the internal processing information IPI in the internal processor 320 through the internal operation data path may be written back to the memory cell array 122.

When the internal processing information IPI read from the memory cell array 122 includes or is an internal processing operation command IPCMD indicating a type of the internal processing operation, the internal processor 320 may store an internal processing read command PIM_READ and/or an internal processing write command PIM_WRITE constituting the internal processing operation command IPCMD in the command queue 324. The command queue 324 may store the internal processing operation command IPCMD including at least one of the internal processing read command PIM_READ and the internal processing write command PIM_WRITE.

The internal processing operation command IPCMD of the command queue 324 may be transmitted to the PIM agent 116 through the second channel CH2, and the PIM agent 116 may transmit the internal processing operation command IPCMD received from the command queue 324 to the memory controller 114 through the bus 118 in the host device 110. The memory controller 114 may transmit the internal processing operation command IPCMD including the received internal processing read command PIM_READ and/or the internal processing write command PIM_WRITE as the command CMD to the command/address buffer 310 of the memory device 120 through the first channel CH1.

The command detector 326 may determine whether the command CMD received by the command/address buffer 310 includes or is an internal processing operation command IPCMD. When it is determined that the received command CMD includes or is an internal processing operation command IPCMD, the command detector 326 may transmit the internal processing operation command IPCMD to the internal processor 320. The internal processor 320 may perform an internal processing operation according to the internal processing operation command IPCMD including the internal processing read command PIM_READ and/or the internal processing write command PIM_WRITE.

Figure 4:
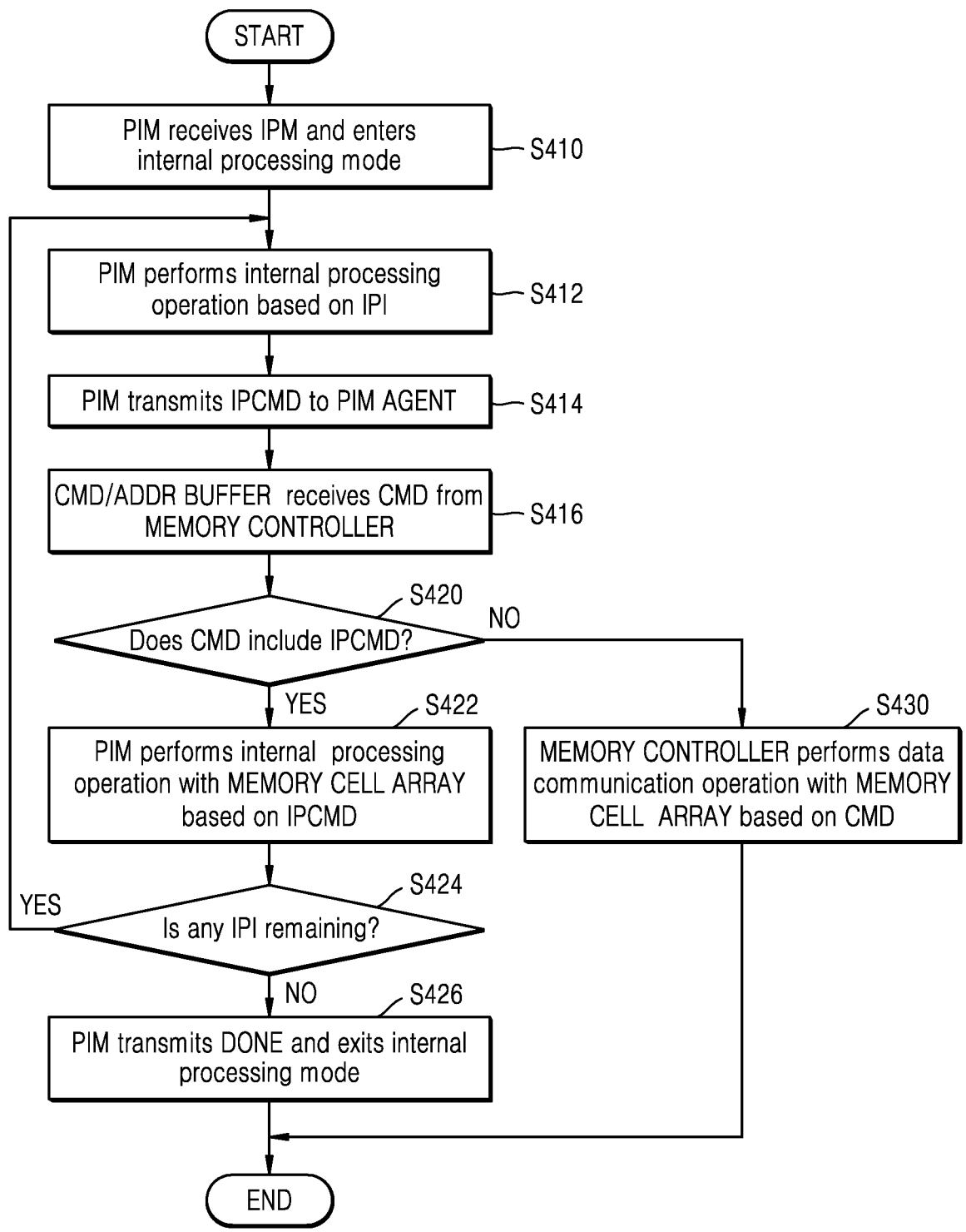
FIG. 4 is a flowchart illustrating a method of operating a memory device, according to an embodiment of the inventive concept.

FIG. 4 is a flowchart illustrating a method of operating a memory device, according to an embodiment of the inventive concept.

Referring to FIGS. 3 and 4, in operation S410, the PIM 124 may receive an internal processing mode signal IPM and enter the internal processing mode in response to the internal processing mode signal IPM.

In operation S412, the PIM 124 may perform an internal processing operation based on the internal processing information IPI stored in the memory cell array 122.

In operation S414, the PIM 124 may transmit to the PIM agent 116 of the host device 110 an internal processing operation command IPCMD generated during operation in the internal processing mode. The PIM 124 may read the internal processing information IPI from the memory cell array 122. When the read internal processing information IPI includes or is an internal processing operation command IPCMD, the PIM 124 may transmit to the PIM agent 116 an internal processing read command PIM_READ and/or an internal processing write command PIM_WRITE constituting the internal processing operation command IPCMD.

In operation S416, the command/address buffer 310 may receive a command CMD from the memory controller 114 of the host device 110.

In operation S420, the command detector 326 may determine whether the command CMD received from the memory controller 114 includes or is an internal processing operation command IPCMD. As a result of the determination, when the command CMD received from the memory controller 114 includes or is the internal processing operation command IPCMD, the method may proceed to operation S422, and when the received command CMD does not include or is not the internal processing operation command IPCMD, the method may proceed to operation S430.

In operation S422, the PIM 124 may perform an internal processing operation with the memory cell array 122 according to the internal processing operation command IPCMD. That is, the internal processing data used in the internal processing operation according to the internal processing operation command IPCMD may be read from the memory cell array 122 or the processing result of the internal processing operation may be written into the memory cell array 122.

In operation S424, the PIM 124 may determine whether the internal processing operation is completed based on the internal processing information IPI stored in the memory cell array 122. For example, the PIM 124 may determine whether there is any internal processing information IPI remaining in the memory cell array 122. As a result of the determination, when the internal processing operation is completed, the method may proceed to operation S426. When there remains an internal processing operation to be performed based on the internal processing information IPI, the method may proceed to operation S412 and perform the internal processing operation based on the remaining internal processing information IPI.

In operation S426, the PIM 124 may transmit a completion signal DONE of the internal processing operation to the PIM agent 116 of the host device 110 and exit the internal processing operation mode.

As a result of the determination in operation S420, when the command CMD received from the memory controller 114 does not include or is not the internal processing operation command IPCMD, that is, when the command CMD includes or is a data transaction command, a data transaction operation such as a data communication operation may be performed between the memory controller 114 and the memory cell array 122 according to the data transaction command (operation S430).

Figure 5:
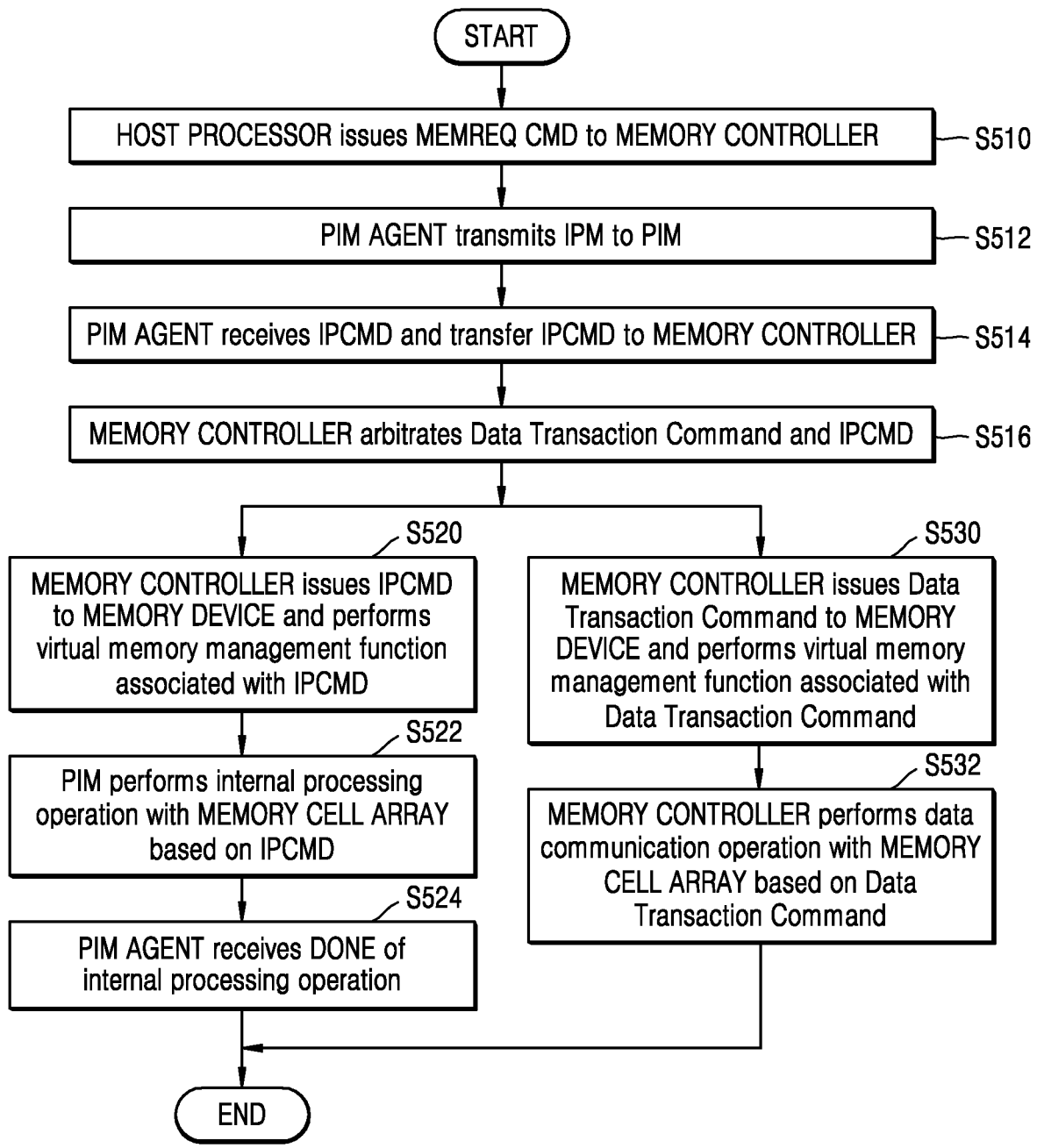
FIG. 5 is a flowchart illustrating a method of operating a host device, according to an embodiment of the inventive concept.

FIG. 5 is a flowchart illustrating a method of operating a host device, according to an embodiment of the inventive concept.

Referring to FIGS. 1 and 5, in operation S510, the host processor 112 may issue a memory request command MEMREQ CMD for a computational operation to the memory controller 114, which generates a data transaction command to perform a data transaction operation according to the memory request command MEMREQ CMD.

In operation S512, the PIM agent 116 may transmit an internal processing mode signal IPM to the PIM 124 of the memory device 120. The PIM 124 may enter the internal processing mode and perform an internal processing operation in response to the internal processing mode signal IPM.

In operation S514, the PIM agent 116 may receive an internal processing operation command IPCMD including an internal processing read command PIM_READ and/or an internal processing write command PIM_WRITE generated during the internal processing operation of the PIM 124. The PIM agent 116 may transmit the received internal processing operation command IPCMD to the memory controller 114.

In operation S516, the memory controller 114 may perform an arbiter function between the data transaction command and the internal processing operation command IPCMD to determine a priority thereof. As a result of the determination, when the priority command is the internal processing operation command IPCMD, the method may proceed to operation S520, and when the priority command is the data transaction command for the computational operation, the method may proceed to operation S530.

In operation S520, the memory controller 114 may issue the internal processing operation command IPCMD to the memory device 120 through the CMD buses and/or the CMD signal lines of the first channel CH1. In this case, the memory controller 114 may perform a virtual memory management function such as a virtual memory address translation associated with the internal processing operation command IPCMD, and issue the internal processing operation command IPCMD to the memory device 120.

In operation S522, the PIM 124 may perform an internal processing operation such as a data communication operation with the memory cell array 122 according to the internal processing operation command IPCMD.

In operation S524, the PIM agent 116 may receive a completion signal DONE of the internal processing operation from the PIM 124 when the PIM 124 completes the internal processing operation according to the internal processing information IPI.

In operation S530, the memory controller 114 may issue a data transaction command for a computational operation to the memory device 120 through the CMD buses and/or the CMD signal lines of the first channel CH1. In this case, the memory controller 114 may issue the data transaction command to the memory device 120 by performing a virtual memory management function such as a virtual memory address translation associated with the data transaction command.

In operation S532, the memory controller 114 may perform a data communication operation with the memory cell array 122 according to the data transaction command associated with memory requests.

Figure 6:
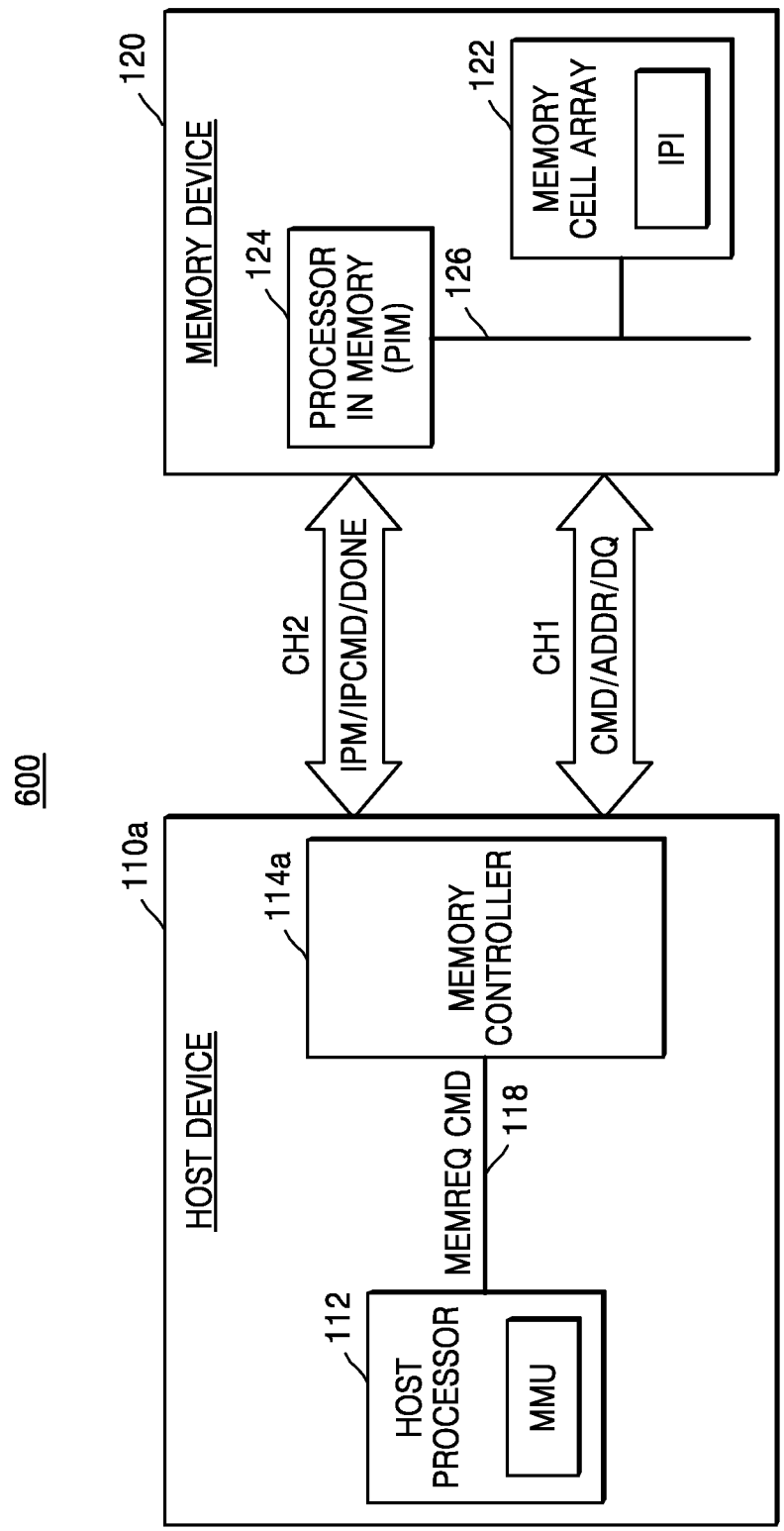
FIG. 6 is a block diagram illustrating a system including a memory device performing an internal processing operation, according to another embodiment of the inventive concept.

FIG. 6 is a block diagram illustrating a system including a memory device performing an internal processing operation, according to another embodiment of the inventive concept.

A system 600 of FIG. 6 may include a host device 110a and a memory device 120. Unlike the host device 110 of the system 100 illustrated in FIG. 1, the host device 110a may include a host processor 112 and a memory controller 114a and may not include the PIM agent 116, and the other components may be similar to those in FIG. 1. Hereinafter, the difference from FIG. 1 will be mainly described.

Referring to FIG. 6, the memory controller 114a may be configured to include the function of the PIM agent 116 illustrated in FIG. 1. The memory controller 114a may control the memory device 120 to operate in the internal processing mode. The memory controller 114a may activate and transmit an internal processing mode signal IPM to the memory device 120 through the first channel CH1 or the second channel CH2. The memory controller 114a may receive an internal processing operation command IPCMD including an internal processing read command PIM_READ and/or an internal processing write command PIM_WRITE generated while the memory device 120 operates in the internal processing mode, from the memory device 120 through the second channel CH2. The memory controller 114a may receive a completion signal DONE indicating that the internal processing operation is completed, from the memory device 120 through the second channel CH2.

The system 600 may include a host device 110a and a memory device 120 for performing a computational operation. Under the control of the host device 110a, the memory device 120 may perform an internal processing operation based on a memory request operation according to a computational operation and internal processing information IPI stored in the memory cell array 122. When the internal processing information IPI includes or is an internal processing operation command IPCMD indicating a type of the internal processing operation, the memory device 120 may transmit the internal processing operation command IPCMD to the host device 110a. The host device 110a may issue a data transaction command for a memory request operation to the memory device 120. The host device 110a may issue a priority command to the memory device 120 by arbitrating between the data transaction command and the internal processing operation command IPCMD received from the memory device 120. When issuing the priority command to the memory device 120, the host device 110a may perform a virtual memory management function including a virtual memory address translation associated with the priority command. The memory device 120 may generate a completion signal indicating completion of the internal processing operation performed based on the internal processing information IPI and transmit the completion signal to the host device 110a.

Figure 7:
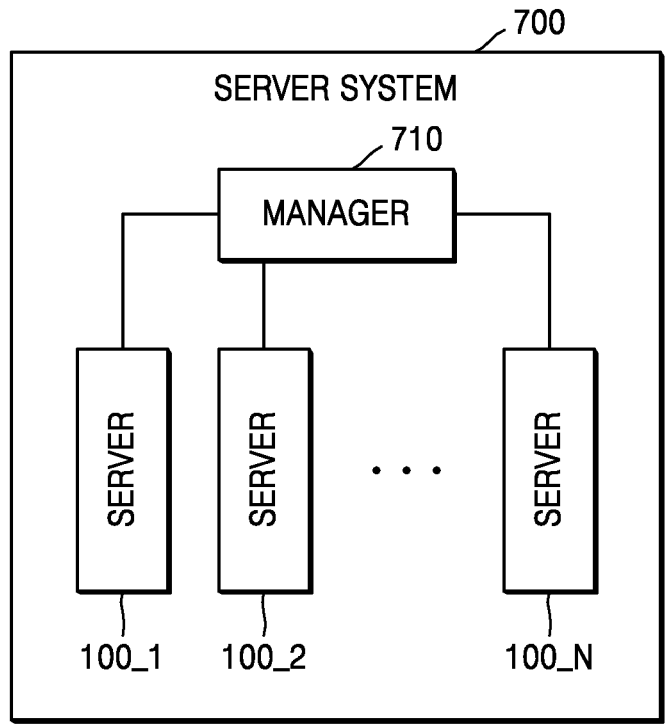
FIG. 7 is a block diagram illustrating a server system to which a system including a memory device performing an internal processing operation, according to an embodiment of the inventive concept, may be applied.

FIG. 7 is a block diagram illustrating a server system to which a system including a memory device performing an internal processing operation, according to an embodiment of the inventive concept may be applied.

Referring to FIG. 7, a server system 700 may include a plurality of servers 100_1, 100_2, ..., 100_N. The plurality of servers 100_1, 100_2, ..., 100_N may include a storage device connected to a PCIe bus. Peripheral Component Interconnect Express (PCIe) is a high-speed serial computer expansion bus standard designed to replace PCI, PCI-X, and Accelerated Graphics Port (AGP) bus standards. PCIe may include a higher maximum system bus throughput, a lower I/O pin count, a smaller physical footprint, a good performance-scaling for bus devices, and a more detailed error detection, and a report mechanism. The plurality of servers 100_1, 100_2, ..., 100_N may be connected to a manager 710. The plurality of servers 100_1, 100_2, ..., 100_N may include or be identical or similar to the system 100 described above with reference to FIGS. 1 to 6.

Each of the plurality of servers 100_1, 100_2, ..., 100_N may include a host device and a memory device for performing a computational operation. Under the control of the host device, the memory device may perform an internal processing operation based on a memory request operation according to a computational operation and internal processing information IMI stored in a memory cell array. When the internal processing information IMI includes or is an internal processing operation command IPCMD indicating a type of the internal processing operation, the memory device may transmit the internal processing operation command IPCMD including an internal processing read command PIM_READ and/or an internal processing write command PIM_WRITE to the host device. The host device may issue a data transaction command for the memory request operation to the memory device. The host device may issue a priority command to the memory device by arbitrating between the data transaction command and the internal processing operation command IPCMD received from the memory device. When issuing the priority command to the memory device, the host device may perform a virtual memory management function including a virtual memory address translation associated with the priority command. The memory device may generate a completion signal indicating completion of the internal processing operation performed based on the internal processing information IMI and transmit the completion signal to the host device.

Figure 8:
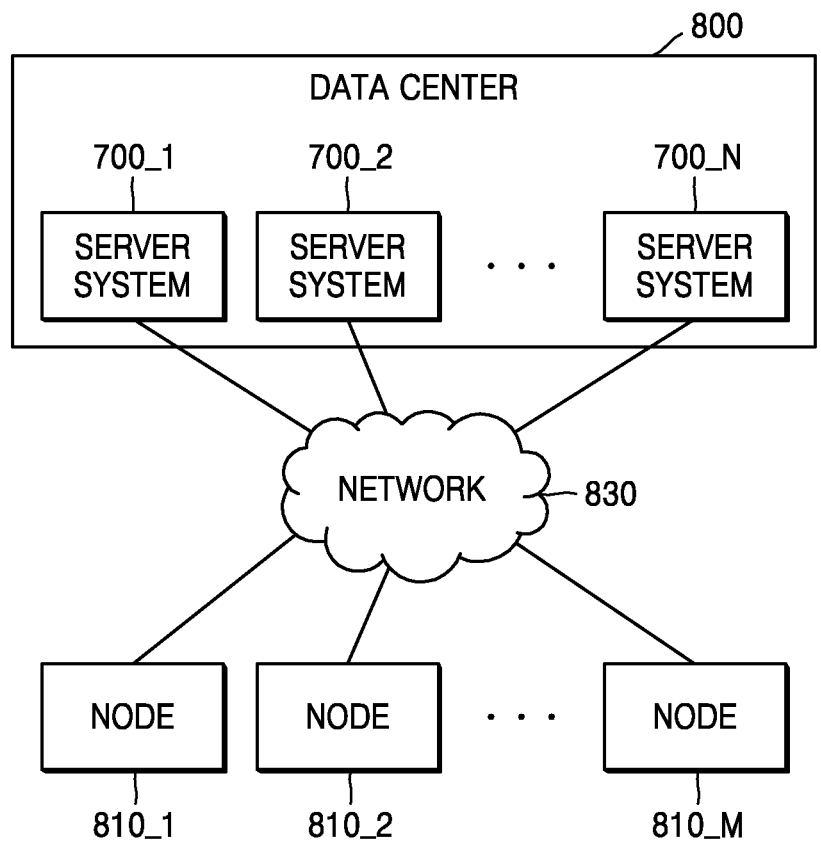
FIG. 8 is a block diagram illustrating a data center to which a system including a memory device performing an internal processing operation, according to an embodiment of the inventive concept, may be applied.

FIG. 8 is a block diagram illustrating a data center to which a system including a memory device performing an internal processing operation, according to an embodiment of the inventive concept may be applied.

Referring to FIG. 8, a data center 800 may include a plurality of server systems 700_1, 700_2, ..., 700_N. Each of the plurality of server systems 700_1, 700_2, ..., 700_N may be similar or identical to the server system 700 illustrated in FIG. 7. The plurality of server systems 700_1, 700_2, ..., 700_N may communicate with various nodes 810_1, 810_2, ..., 810_M through a network 830 such as the Internet. Although the network 830 is illustrated as a separate single network, it may also be any type of network that may be generally understood by those of ordinary skill in the art. The network 830 may be a personal or public network, a wired or wireless network, or an entire or partial network. According to an embodiment, the network 830 may be a global network such as the Internet or the World Wide Web (in short, "Web"), a wide area network (WAN), or a local area network (LAN). The nodes 810_1, 810_2, ..., 810_M may include any one of client computers, other servers, remote data centers, and storage systems.

Each of the plurality of server systems 700_1, 700_2, ..., 700_N and/or the nodes 810_1, 810_2, ..., 810_M may include a host device and a memory device for performing a computational operation. Under the control of the host device, the memory device may perform an internal processing operation based on a memory request operation according to a computational operation and internal processing information IMI stored in a memory cell array. When the internal processing information IMI includes or is an internal processing operation command IPCMD indicating a type of the internal processing operation, the memory device may transmit the internal processing operation command IPCMD including an internal processing read command PIM_READ and/or an internal processing write command PIM_WRITE to the host device. The host device may issue a data transaction command for the memory request operation to the memory device. The host device may issue a priority command to the memory device by arbitrating between the data transaction command and the internal processing operation command IPCMD received from the memory device. When issuing the priority command to the memory device, the host device may perform a virtual memory management function including a virtual memory address translation associated with the priority command. The memory device may generate a completion signal indicating completion of the internal processing operation performed based on the internal processing information IMI and transmit the completion signal to the host device.

Although the inventive concept has been described with reference to the embodiments illustrated in the drawings, this is merely an example and those of ordinary skill in the art will understand that various modifications and other equivalent embodiments may be derived therefrom. Thus, the spirit and scope of the inventive concept should be defined by the appended claims.

While the inventive concept has been particularly shown and described with reference to embodiments thereof, it will be understood that various changes in form and details may be made therein without departing from the spirit and scope of the following claims.

What is claimed is:

1. A method of operating a memory device including a memory cell array and a processor-in-memory (PIM), the method comprising:
   receiving an internal processing mode signal, the internal processing mode signal being transmitted from a memory controller outside of the memory device;
   entering an internal processing mode in response to the internal processing mode signal;
   uploading internal processing information into the memory cell array, the internal processing information being transmitted from the memory controller during the internal processing mode;
   reading the internal processing information from the memory cell array;
   performing, by the PIM, an internal processing operation based on the read internal processing information;
   determining, by the PIM, whether the read internal processing information includes an internal processing operation command, the internal processing operation command indicating a type of the internal processing operation of the PIM and
   generating, by the PIM, the internal processing operation command during the internal processing operation.

2. The method of claim 1, wherein the uploading of the internal processing information into the memory cell array comprises:
   receiving the internal processing information through signal lines of a first channel between the memory controller and the memory device; and
   storing the internal processing information in the memory cell array.

3. The method of claim 2, wherein the signal lines of the first channel transmit commands, addresses, and data of the memory device.

4. The method of claim 3, wherein the receiving of the internal processing mode signal uses signal lines of a second channel between the memory controller and the memory device, and
   the second channel is a sideband of the first channel.

5. The method of claim 4, further comprising
   transmitting, by the PIM, the internal processing operation command to the memory controller through the signal lines of the second channel.

6. The method of claim 5, wherein the internal processing operation command comprises an internal processing read command and an internal processing write command associated with the internal processing operation.

7. A method of operating a memory device including a memory cell array and a processor-in-memory (PIM), the method comprising:
- uploading internal processing information into the memory cell array, the internal processing information being transmitted from a memory controller through signal lines of a first channel between the memory controller and the memory device during an internal processing mode;
- reading the internal processing information from the memory cell array;
- performing, by the PIM, an internal processing operation based on the read internal processing information;
- generating, by the PIM, an internal processing operation command during the internal processing operation; and
- transmitting, by the PIM, the internal processing operation command to the memory controller.

8. The method of claim 7, wherein the signal lines of the first channel transmit commands, addresses, and data of the memory device.

9. The method of claim 8, wherein the transmitting of the internal processing operation command to the memory controller uses signal lines of a second channel between the memory controller and the memory device, and
the second channel is a sideband of the first channel.

10. The method of claim 9, further comprising:
- receiving an internal processing mode signal from the memory controller through the signal lines of the second channel; and
- entering the internal processing mode in response to the internal processing mode signal.

11. The method of claim 7, wherein the internal processing operation command comprises an internal processing read command and an internal processing write command associated with the internal processing operation.

12. A method of operating a memory controller including an arbiter to control a memory device, the method comprising:
- issuing a data transaction command for accessing the memory device;
- transmitting an internal processing mode signal to the memory device, the memory device entering an internal processing mode in response to the internal processing mode signal;
- receiving an internal processing operation command from the memory device during the internal processing mode;
- determining, by the arbiter, a priority command from among the data transaction command and the internal processing operation command; and
- issuing the priority command to the memory device.

13. The method of claim 12, wherein the issuing of the priority command to the memory device uses signal lines of a first channel between the memory controller and the memory device, and
the signal lines of the first channel transmit commands, addresses, and data of the memory device.

14. The method of claim 13, wherein the issuing of the data transaction command for accessing the memory device uses the signal lines of the first channel.

15. The method of claim 13, wherein the receiving of the internal processing operation command from the memory device during the internal processing mode uses signal lines of a second channel between the memory controller and the memory device, and
the second channel is a sideband of the first channel.

16. The method of claim 15, wherein the transmitting of the internal processing mode signal to the memory device uses the signal lines of the second channel.

17. The method of claim 15, further comprising
receiving a completion signal from the memory device, the completion signal indicating the memory device to exit the internal processing mode.

18. The method of claim 17, wherein the receiving of the completion signal from the memory device uses the signal lines of the second channel.

19. The method of claim 12, further comprising
transmitting internal processing information to the memory device through the signal lines of the first channel,
wherein the internal processing information is stored in a memory cell array of the memory device and read from the memory cell array, and
the memory device determines whether the read internal processing information includes the internal processing operation command.

20. The method of claim 12, wherein the internal processing operation command comprises an internal processing read command and an internal processing write command associated with the internal processing operation.

* * * * *